United States Patent
Wilmoth

(10) Patent No.: US 10,393,803 B2
(45) Date of Patent: Aug. 27, 2019

(54) MEMORY LOOPBACK SYSTEMS AND METHODS

(71) Applicant: Micron Technology, Inc., Boise, ID (US)

(72) Inventor: David D. Wilmoth, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 79 days.

(21) Appl. No.: 15/693,114

(22) Filed: Aug. 31, 2017

(65) Prior Publication Data
US 2019/0064265 A1 Feb. 28, 2019

(51) Int. Cl.
| | | |
|---|---|---|
| G01R 31/317 | (2006.01) | |
| G06F 11/30 | (2006.01) | |
| G01R 31/3185 | (2006.01) | |
| G06F 9/38 | (2018.01) | |
| G11C 7/22 | (2006.01) | |

(52) U.S. Cl.
CPC . *G01R 31/31716* (2013.01); *G01R 31/31713* (2013.01); *G01R 31/31715* (2013.01); *G01R 31/31726* (2013.01); *G01R 31/318536* (2013.01); *G01R 31/318547* (2013.01); *G06F 11/3051* (2013.01); *G06F 9/381* (2013.01); *G11C 7/222* (2013.01)

(58) Field of Classification Search
CPC ..... G11C 7/222; G06F 11/3051; G06F 9/381; G01R 31/31713; G01R 31/31715; G01R 31/31716; G01R 31/31726; G01R 31/318536; G01R 31/318547
See application file for complete search history.

(56) References Cited

U.S. PATENT DOCUMENTS

| | | | |
|---|---|---|---|
| 6,289,476 B1 | 9/2001 | Cowles | |
| 6,539,536 B1* | 3/2003 | Singh | G06F 17/5045 716/102 |
| 2002/0172086 A1 | 11/2002 | Abedifard | |
| 2006/0161744 A1 | 7/2006 | Fukuda | |
| 2009/0168525 A1 | 7/2009 | Olbrich et al. | |
| 2014/0189457 A1* | 7/2014 | Mak | G01R 31/31716 714/745 |

FOREIGN PATENT DOCUMENTS

WO  2014-105131 A1  7/2014

OTHER PUBLICATIONS

International Search Report for PCT Application No. PCT/US2018/027817 PCT; ISRWO dated Oct. 2, 2018; 11 Pages.

* cited by examiner

*Primary Examiner* — Cynthia Britt
*Assistant Examiner* — Sazzad Hossain
(74) *Attorney, Agent, or Firm* — Fletcher Yoder, P.C.

(57) ABSTRACT

One embodiment of the present disclosure describes a memory system that may include one or more memory devices that may store data. The memory devices may receive command signals to access the stored data as a loopback signal. The memory devices may operate in a normal operational mode, a loopback operational mode, a retrieval operational mode, a non-inverting pass-through operational sub-mode, and an inverting pass-through operational sub-mode. The operational modes facilitate the transmission of the loopback signal for the purpose of monitoring of memory device operations. A selective inversion technique, which uses the operational modes, may protect the loopback signal integrity during transmission.

8 Claims, 7 Drawing Sheets

MEMORY LOOPBACK SYSTEMS AND METHODS

BACKGROUND

The present disclosure relate generally to memory devices and, more particularly, to monitoring operation of a memory device.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, a computing system may include electronic devices that, in operation, communicate information via electrical signals. For example, a computing system may include a processor communicatively coupled to a memory device, such as a dynamic random-access memory (DRAM) device implemented on dual in-line memory module (DIMM). In this manner, the processor may communicate with the memory device, for example, to retrieve executable instructions, retrieve data to be processed by the processor, and/or store data output from the processor.

To facilitate improving operational reliability, operation of a memory device may be monitored, for example, by a host controller to facilitate debugging operation of the memory device and/or performing diagnostics on operation of the memory device. In some instances, operation of a memory device may be monitored based on analysis of signals indicative of data input to and/or output from the memory device. In other words, accuracy of operational monitoring may be affected by integrity of such signals returned from the memory device.

BRIEF DESCRIPTION OF THE DRAWINGS

Various aspects of this disclosure may be better understood upon reading the following detailed description and upon reference to the drawings in which.

DETAILED DESCRIPTION

Figure 1:
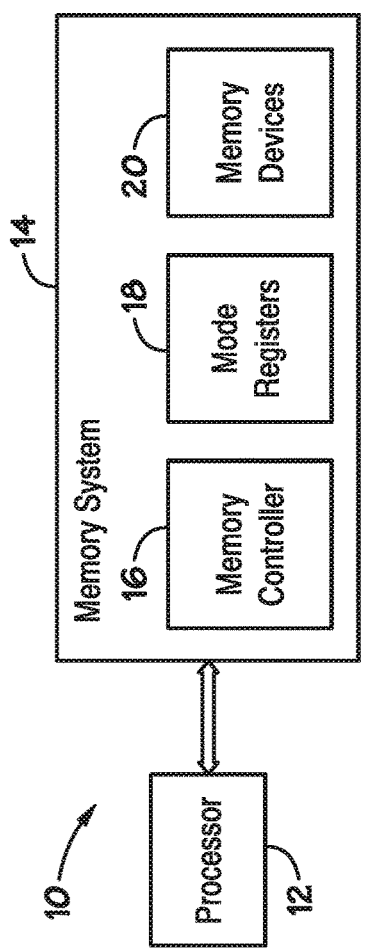
FIG. 1 is a block diagram of a computing system, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Generally, a computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, and/or store data output from the processor.

To facilitate monitoring operation of memory, the present disclosure provides techniques for implementing a loopback path through one or more memory devices, which enables feeding back a loopback signal indicative of memory device operation. In some embodiments, a memory device may generate a loopback signal based at least in part on a data (e.g., DQ) signal and/or a strobe (e.g., DQS) signal output, for example, to the processor. As operating frequencies continue to increase to facilitate providing increased data transfer speeds, in some embodiments, a memory device may generate a loopback signal with a lower frequency compared to a corresponding data signal, for example, by sampling every fourth bit using a loopback strobe signal that has one fourth the frequency of a corresponding strobe signal.

Additionally, in some embodiments, the loopback path may be implemented to connect multiple memory devices in series, for example, with a loopback pin on a memory module. In other words, the loopback path may be implemented by multiple memory devices connected in a daisy chain. In such embodiments, a loopback signal generated by a target memory device may be transmitted through multiple other memory devices, for example, before being analyzed by a host controller to monitor (e.g., debug and/or diagnose) operation of the target memory device. In other words, the accuracy of operational monitoring may be affected by the signal integrity of a loopback signal.

In some instances, transmitting a loopback signal via a daisy chain loopback path may introduce distortion on the loopback signal, for example, due to process variations, voltage variations, and/or temperature variations. In fact, such variations may cause loopback signal distortion due to the inherent nature of components within a memory device. For example, a memory device (e.g., downstream relative to the target memory device) may include a switching component (e.g., device) that generates an output loopback signal based at least in part on a received loopback signal. In particular, an edge (e.g., transition from a logical high to a logical low or vice versa) in the received loopback signal may drive an edge in the generated loopback signal.

However, in some instances, the time the loopback signal takes to transition the switching components from a logical high to a logical low may differ from the time the loopback signal takes to transition the switching components from a logical low to a logical high. When connected in a daisy chain, such timing differences may propagate through multiple memory devices. For example, such timing differences may result in a slow edge of a received loopback signal being used to drive a slow edge of a generated loopback signal, thereby stacking the effect of the timing differences.

To facilitate improving memory diagnostics and/or debugging, the present disclosure provides techniques to facilitate improving loopback signal integrity, for example, when loopback signals are transmitted via a daisy chain loopback path to a loopback pin. In some embodiments, a memory device may be controlled to selectively invert a received loopback signal before output to a subsequent (e.g., downstream) memory device. In this manner, a slow edge (e.g., logical low to logical high) of the received loopback signal may be used to drive a fast edge (e.g., logical high to logical low) of the output loopback signal, thereby reducing likelihood that such timing variations stacking across multiple memory devices.

To help illustrate, an example of a computing system 10 that includes a processor 12 and a memory system 14 is shown in FIG. 1. The computing system 10 may be any suitable computing product, such as a handheld computing device, a tablet computing device, a notebook computing device, and the like. It should be appreciated that the depicted computing system 10 is merely intended to be illustrative not limiting. In particular, in some embodiments, depicted components may be combined into fewer components or separated into additional components, for example, with the processor 12 including a memory controller 16.

The processor 12 may execute instruction stored in the memory system 14 to perform operations in the computing system 10. As such, the processor 12 may include one or more general purpose microprocessors, one or more application specific processors (ASICs), one or more field programmable logic arrays (FPGAs), or any combination thereof. Additionally, when implemented to monitor operation of the memory system 14, the processor 12 may include a host controller.

Furthermore, the memory system 14 may include the memory controller 16, one or more mode registers 18, and one or more memory devices 20. In some embodiments, the memory controller 16 may generally control operation of the memory system 14, for example, to control external access to the memory devices 20 implemented in the memory system 14. Additionally, the mode registers 18 may store data indicative of an operational mode. For example, the mode registers 18 may indicate whether to operate a memory device 20 in a normal mode or a loopback mode, in which the memory device 20 operates to output a loopback signal.

The memory devices 20 may include one or more tangible, non-transitory, computer-readable media that store instructions executable by and/or data to be processed by the processor 12. In some embodiments, storage provided by one or more memory devices 20 may be logically organized into one or more banks. Additionally, in some embodiments, one or more memory devices 20 may be physically organized into more or more memory modules. For example, a memory device 20 may be a dynamic random-access memory (DRAM) device implemented on a dual in-line memory module (DIMM).

Figure 2:
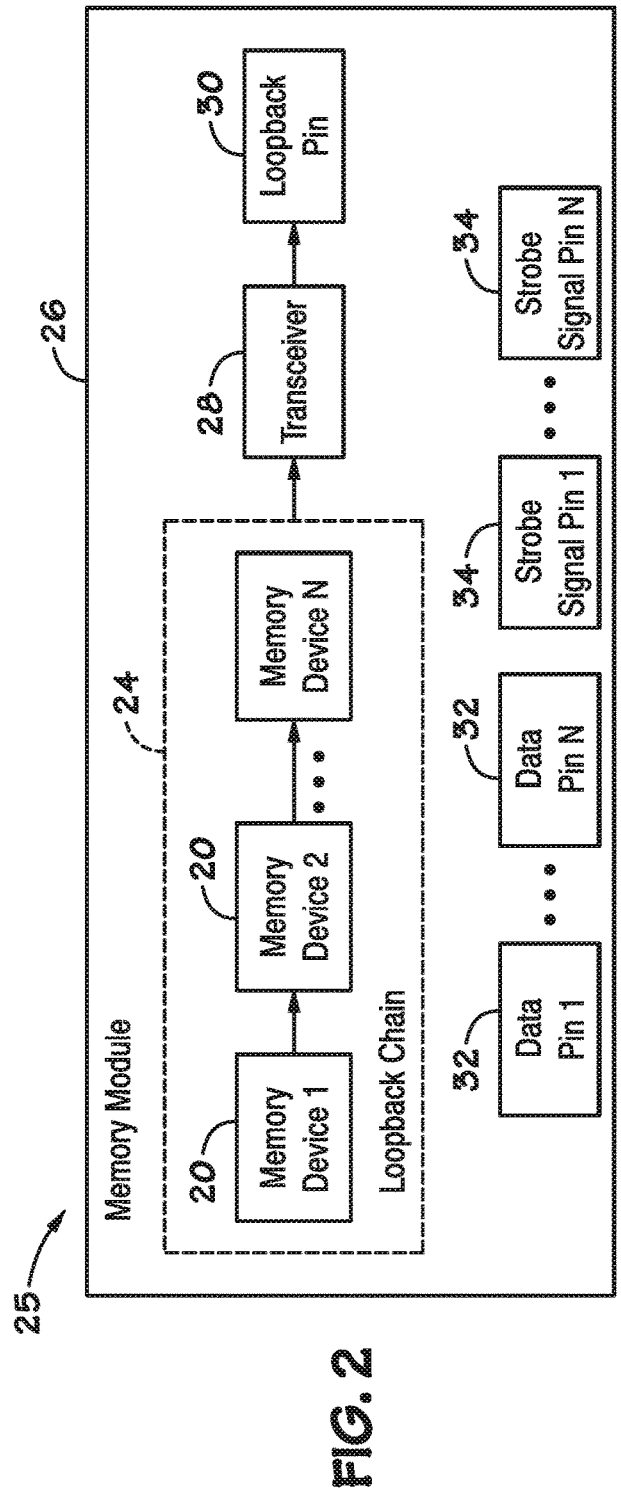
FIG. 2 is a block diagram of a memory module in the computing system of FIG. 1, in accordance with an embodiment.

To help illustrate, an example of a memory module 26 that includes multiple memory devices 20 coupled in a loopback chain 24, a transceiver 28, a loopback pin 30, one or more data pins 32, and one or more strobe signal pins 34 is shown in FIG. 2. It should be appreciated that the depicted memory modules 26 is merely intended to be illustrative not limiting. For example, in some embodiments, the memory module 26 may include multiple (e.g., two) loopback chains 24 each communicatively coupled to the transceiver 28.

The memory module 26 may provide external access to its memory devices 20 via the data pins 32 and the strobe signal pins 34, for example, while one or more of its memory devices 20 operate in a normal mode. In other words, while operating in the normal mode, the memory controller 16 may instruct the memory module 26 to output data signals based on data stored in the memory devices 20 via the data pins. Additionally, the memory controller 16 may instruct the memory module 26 to output strobe signals used to read the data signals via the strobe signal pins 34.

Furthermore, the memory module 26 may provide external access to its memory device 20 via the loopback pin 30, for example, while one or more of its memory devices 20 operate in a loopback mode. In some embodiments, a memory device 20 may operate in both the loopback mode and the normal mode simultaneously. In any case, while operating in the loopback mode, the loopback chain 24 may output a loopback signal indicative of operation of a targeted memory device 20 to the transceiver 28. In this manner, the transceiver 28 may control output timing of the loopback signal, for example, to coordinate output of loopback signals received from multiple loopback chains 24 implemented in the memory module 26.

In some embodiments, during a loopback operation, any of memory devices 20 connected in the loopback chain 24 may be targeted for operational monitoring. For example, during a first loopback operation, a first memory device 20 in the loopback chain 24 may be targeted for operational monitoring while a second memory device 20 in the loopback chain 24 is targeted during a second loopback operation. To facilitate adjusting targeted memory device 20, in some embodiments, each loopback operation may be performed based at least in part on corresponding loopback parameters, for example, indicative of a memory device 20 targeted for operational monitoring.

To facilitate monitoring operation of a target memory device 20, the target memory device 20 and downstream memory devices 20 (e.g., coupled between the target memory device 20 and the transceiver 28) may operate in a loopback mode during loopback operations. In particular, the target memory device 20 may operate in a retrieval sub-mode such that the target memory device 20 generates a target loopback signals. Additionally, the downstream memory devices 20 may each operate in a pass-through sub-mode such that an output loopback signal is generated based at least in part on a received loopback signal, for example, received from an upstream memory device 20.

In this manner, the target loopback signal may be communicated through one or more memory devices 20 of the loopback chain 24 to the transceiver 28 and, thus, the loopback pin 30 to facilitate monitoring operation of the target memory device 20. As described above, the target loopback signal may be indicative memory device operation and, thus, may be analyzed to monitor (e.g., debug and/or perform diagnostics on) operation of the target memory device 20. However, in some instances, signal integrity and, thus, accuracy of operational monitoring may be affected when the target loopback signal is passed through one or more downstream memory devices 20. To facilitate improving signal integrity, one or more of the downstream memory devices 20 may generate an output loopback signal by selectively inverting a received loopback signal, which at least in some instances may facilitate improving operational monitoring.

Figure 3:
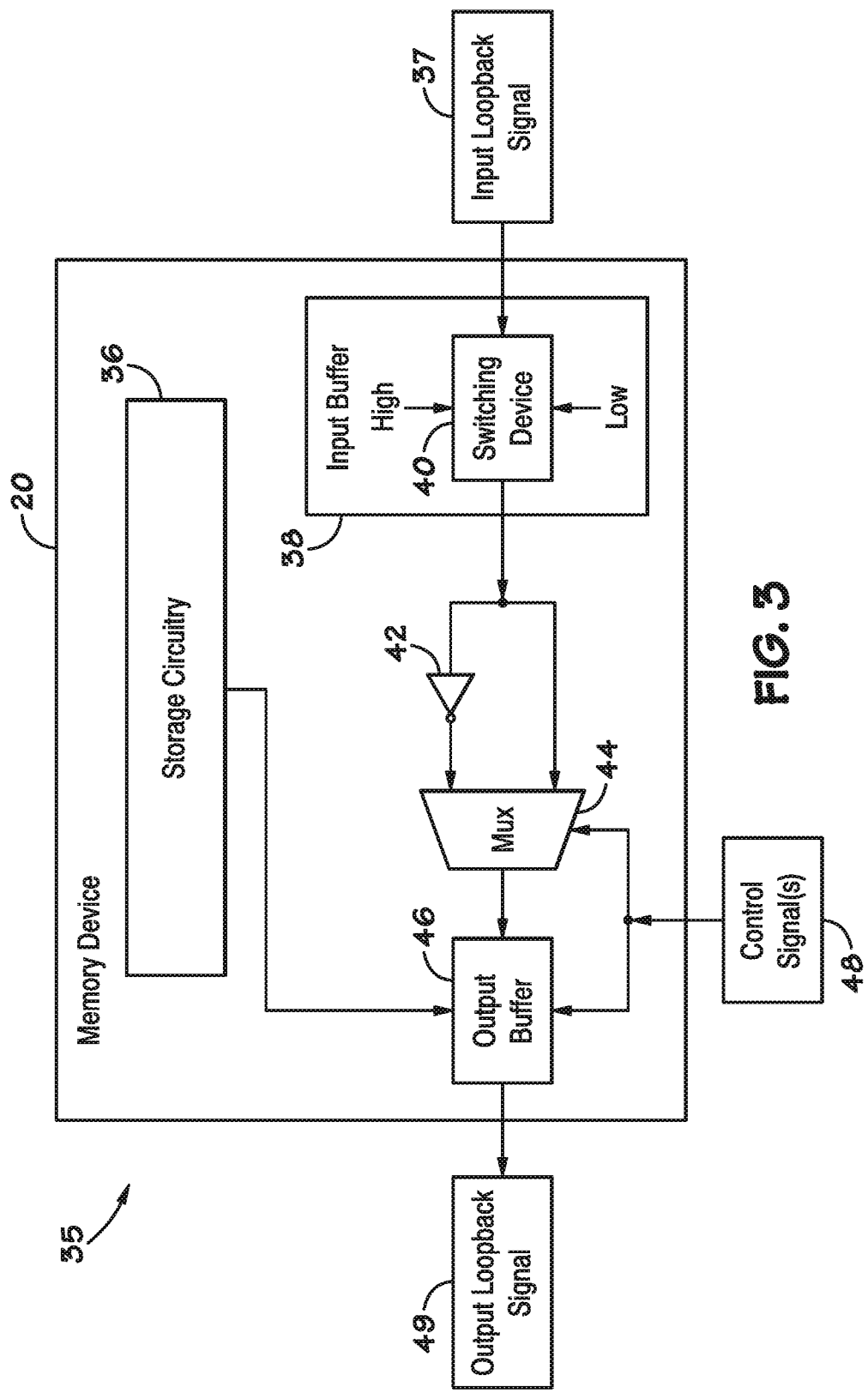
FIG. 3 is a block diagram of a memory device in the memory module of FIG. 2, in accordance with an embodiment.

An example memory device 20, which may be implemented in a loopback chain 24, is shown in FIG. 3. As depicted, the memory device 20 includes storage circuitry 36, an input buffer 38, and an output buffer 46. In some embodiments, the storage circuitry 36 may function to store data in the memory device 20. In other words, the storage circuitry 36 may include memory addresses that store data, which may be accessed to facilitate generating a loopback signal indicative of operation of the memory device 20.

While operating in the loopback mode, a memory device 20 in a loopback chain 24 that stores data may be targeted for operational monitoring. The target loopback signal originates from the targeted data of the targeted memory device 20 and passes through one or more downstream memory devices 20. To access the target data, a target memory device may operate in a retrieval sub-mode of the loopback mode, for example, as instructed by the memory controller 16 via one or more control signals and/or values indicated in the mode registers 18. In the retrieval sub-mode, the target memory device 20 may generate a loopback signal indicative of the target data (e.g., by sampling or sub-sampling a corresponding data signal) for output by the output buffer 46. The memory device 20 may transmit the output loopback signal 49, for example, to a downstream memory device 20 in the loopback chain 24 or the transceiver 28.

Additionally, memory devices 20 downstream of the target memory device 20 (e.g., coupled between target memory device 20 and loopback pin 30) may operate in a pass-through sub-mode of the loopback mode, for example, as instructed by the memory controller 16 via one or more control signals and/or values indicated in the mode registers 18. While operating in the pass-through sub-mode, a memory device 20 may receive an input loopback signal 37 from an upstream memory device 20 in the loopback chain 24 via the input buffer 38.

In some embodiments, the input buffer 38 may include one or more switching devices 40. The input loopback signal 37 may drive the switching device 40 either to a logical high or to a logical low. A physical threshold (e.g., a threshold voltage) may exist that the input loopback signal 37 meets to set the switching device 40 to the logical high. For example, when the input loopback signal 37 meets the physical threshold, the switching device 40 may output a logical high. On the other hand, when the input loopback signal 37 does not meet the physical threshold, the switching device 40 may output a logical low. In this manner, the input buffer 38 may output a non-inverted loopback signal based at least in part on the input loopback signal 37.

As depicted, an inverter 42 and a multiplexer 44 are communicatively coupled between the input buffer 38 and the output buffer 46. In operation, the inverter 42 may generate an inverted loopback signal by inverting the non-inverted loopback signal. In other words, the inverter 42 may generate the inverted loopback signal such that a logic high to logic low transition on the input loopback signal 37 drives a logic low to logic high transition on the inverted loopback signal and a logic low to logic high transition on the input loopback signal drives a logic high to logic low transition on the inverted loopback signal.

Additionally, the multiplexer 44 may act to select either the inverted loopback signal or the non-inverted loopback signal as a pass-through loopback signal to be output through the output buffer 46. In some embodiments, the multiplexer 44 may act to select the pass-through loopback signal based at least in part on control signals (e.g., inversion control signals), for example, received from the memory controller 16. For example, the multiplexer 44 may act to select the inverted loopback signal as the pass-through loopback signal when an inversion control signal is a logic low (e.g., default or 0 bit) and the non-inverted loopback signal as the pass-through loopback signal when the inversion control signal is a logic high (e.g., 1 bit).

In other words, each downstream memory device 20 may be instructed to selectively operate in an inverting pass-through sub-mode or non-inverting pass-through sub-mode. As described above, when operating in a pass-through sub-mode, a memory device 20 may output a pass-through output loopback signal 49. On the other hand, when operating in a retrieval sub-mode, a memory device 20 may transmit an output loopback signal 49 indicative of target data communicated with its storage circuitry 36. Thus, in some embodiments, the output buffer 46 may transmit an output loopback signal 49 based at least in part on operational sub-mode of a corresponding memory device 20. For example, the output buffer 46 may transmit the output loopback signal 49 indicative of the target data communicated with its storage circuitry when the corresponding memory device 20 is in the retrieval sub-mode and may transmit the pass-through output loopback signal 49 when the corresponding memory device 20 is in a pass-through sub-mode.

In a similar manner, each memory device 20 in a loopback chain 24 downstream relative to a target memory device 20 may operate in a pass-through sub-mode. In this manner, a target loopback signal generated based at least in part on a loopback signal originating in the loopback chain 24 may be output, for example, by the transceiver 28 via a loopback pin 30. As described above, a target loopback signal may be indicative of memory device operation and, thus, may be analyzed to monitor (e.g., debug or perform diagnostics) operation of a target memory device 20, for example, by a host controller. In other words, operational of one or more memory devices 20 in a loopback chain 24 may be controlled to facilitate monitoring operation of a target memory device 20.

Figure 4:
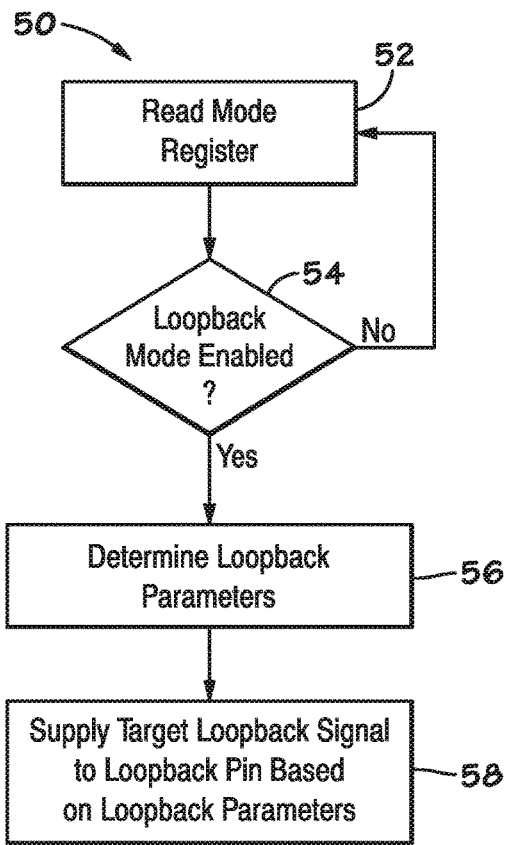
FIG. 4 is a flow diagram of a process for operating the memory module of FIG. 2, in accordance with an embodiment.

To help illustrate, an example of a process 50 for controlling operation of memory devices 20 coupled in a loopback chain 24 is described in FIG. 4. Generally, the process 50 includes reading mode register (process block 52), checking if a loopback mode is enabled (decision block 54). When loopback mode is enabled, the process 50 includes determining loopback parameters (process block 56) and suppling a target loopback signal to a loopback pin based on the loopback parameters (process block 58). In some embodiments, the process 50 may be implemented by executing instructions stored in a tangible, non-transitory, computer-readable medium, such as one or more memory devices 20, using processing circuitry, such as the processor 12 and/or the memory controller 16.

Thus, in some embodiments, the memory controller 16 may read the mode registers 18 (process block 52). In some embodiments, the mode registers 18 may indicate an operational mode of each memory device 20 implemented on a memory module 26. For example, a mode register 18 may indicate a first value when a memory device 20 is to be operated in a normal mode and a second value when the memory device 20 is to be operated in a loopback mode. Additionally or alternatively, a mode register 18 may indicate a third value when the memory device 20 is to be operated in a retrieval sub-mode, a fourth value when the memory device 20 is to be operated in an inverting pass-through sub-mode, and a fifth value when the memory device 20 is to be operated in a non-inverting pass-through sub-mode. Thus, based at least in part on the mode registers 18, the memory controller 16 may determine an operational mode and continue checking the mode registers 18 until the loopback mode is enabled (decision block 54).

After the loopback mode is enabled, the memory controller 16 may determine loopback parameters to be implemented in the loopback chain 24 (process block 56). To help illustrate, an example of a process 60 for determining loopback parameters is described in FIG. 5. Generally, the process 60 includes determining target data (process block 62), determining a target data pin (process block 64), determining a target memory device (process block 66), setting the target memory device to a retrieval sub-mode (process block 68), setting downstream memory devices to a pass-through sub-mode (process block 70), selectively enabling and disabling inversion in the downstream memory devices (process block 72), and determining a loopback strobe signal (process block 74). In some embodiments, the process 60 may be implemented by executing instructions stored in a tangible, non-transitory, computer-readable medium, such as one or more memory devices 20, using processing circuitry, such as the processor 12 and/or the memory controller 16.

Thus, in some embodiments, the memory controller 16 may determine target data (process block 62). As described above, target data may be indicative of operation of a memory device 20. Additionally, as described above, operation of a memory device 20 may be monitored by a host controller, for example, implemented in a processor 12. Thus, in some embodiments, the memory controller 16 may receive an indication of data targeted to facilitate operational monitoring from the host controller.

Based at least in part on the target data, the memory controller 16 may determine a target data pin 32 on a memory module 26 (process block 64). As described above, data signals may be communicated with a memory device 20 via data signals on a corresponding data pin 32. Thus, in some embodiments, the memory controller 16 may determine the target data pin 32 based at least in part on which data pin 32 on the memory module 26 is used to communicate a data signal corresponding with the target data. Additionally or alternatively, the memory controller 16 may receive an indication of the target data pin 32 from the host controller.

Furthermore, the memory controller 16 may determine a memory device 20 on the memory module 26 targeted for operational monitoring (process block 66). In some embodiments, the memory controller 16 may determine the target memory device 20 based at least in part on the target data and/or the target data pin 32. For example, the memory controller 16 may determine the target memory device 20 based at least in part on which memory device 20 on the memory module 26 utilizes the target data pin 32 and/or which memory device 20 on the memory module 26 communicates (e.g., receives, stores, or outputs) the target data. Additionally or alternatively, the memory controller 16 may receive an indication of the target memory device 20 from the host controller.

The memory controller 16 may instruct the target memory device 20 to operate in a retrieval sub-mode, for example, via one or more control signals 48 (process block 68). Additionally, the memory controller 16 may instruct downstream memory devices 20 to operate in a pass-through sub-mode, for example, via one or more control signals 48 (process block 70). Furthermore, the memory controller 16 may selectively enable and disable signal inversion in each downstream memory device 20 (process block 72). In other words, the memory controller 16 may selectively operate each downstream memory device 20 in either an inverting pass-through sub-mode or a non-inverting pass-through sub-mode (process block 72).

As described above, a control signal 48 supplied to a multiplexer 44 in a memory device 20 may instruct the memory device 20 to selectively enable or disable inversion. Additionally, as described above, generating an output loopback signal 49 in a downstream memory device 20 by selectively inverting an input loopback signal 37 may facilitate improving signal integrity of a target loopback signal used to monitor operation of the target memory device 20. Thus, the selective signal inversion may occur during loopback operations in which loopback signals are transmitted through one or more downstream memory devices 20 operating in the pass-through sub-mode.

Figure 6:
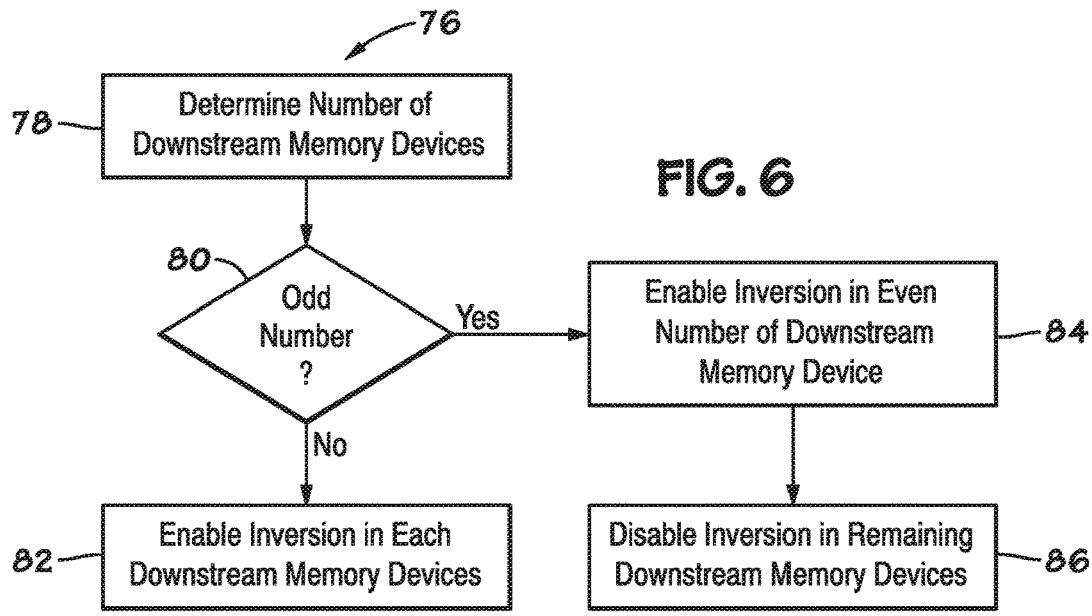
FIG. 6 is a flow diagram of a process for selectively enabling or disabling inversion in memory devices, in accordance with an embodiment.

To help illustrate, an example of a process 76 for selectively enabling and disabling inversion is described in FIG. 6. Generally, the process 76 includes determining the number of downstream memory devices (process block 78), determining whether the number of downstream memory devices is an odd number (decision block 80), and enabling inversion in each downstream memory device when the number of downstream memory devices is not an odd number (process block 82). When the number of downstream memory devices is an odd number, the process 76 includes enabling inversion in an even number of the downstream memory devices (process block 84) and disabling inversion in remaining downstream memory devices (process block 86). In some embodiments, the process 76 may be implemented by executing instructions stored in a tangible, non-transitory, computer-readable medium, such as one or more memory devices 20, using processing circuitry, such as the processor 12 and/or the memory controller 16.

Thus, in some embodiments, the memory controller 16 determines the number of downstream memory devices 20 daisy chain connected to the target memory device 20 (process block 78). For example, the memory controller 16 may determine the number of downstream memory devices 20 by counting number of memory devices 20 coupled between target memory device 20 and the transceiver 28. Additionally or alternatively, the memory controller 16 may receive an indication of the number of downstream memory devices from the host controller.

In some embodiments, each of the memory devices 20 may perform up to one signal inversion. Thus, a target loopback signal output via the loopback pin 30 may be inverted relative to an originating loopback signal when the loopback signal communicated through the loopback chain 24 is inverted an odd number of times. Accordingly, when the number of downstream memory devices 20 is not an odd number (e.g., an even number), the memory controller 16 may enable inversion in each of the downstream memory devices 20, for example, by instructing each to operate in an inverting pass-through sub-mode (process block 82).

On the other hand, when the number of downstream memory devices 20 is an odd number, the memory controller 16 may enable inversion in an even number of the downstream memory device 20, for example, by instructing each to operate in an inverting pass-through sub-mode (process block 84). Additionally, the memory controller 16 may disable inversion in the remaining downstream memory devices 20, for example, by instructing each to operate in a non-inverting pass-through sub-mode (process block 86). In other words, when the number of downstream memory devices 20 is an odd number, the memory controller 16 may disable inversion in an odd number of downstream memory device 20 to facilitate inverting the loopback signal an even number of times before output. In this manner, the memory controller 16 may selectively enable and disable inversion in each downstream memory device 20 in the loopback chain 24.

Figure 5:
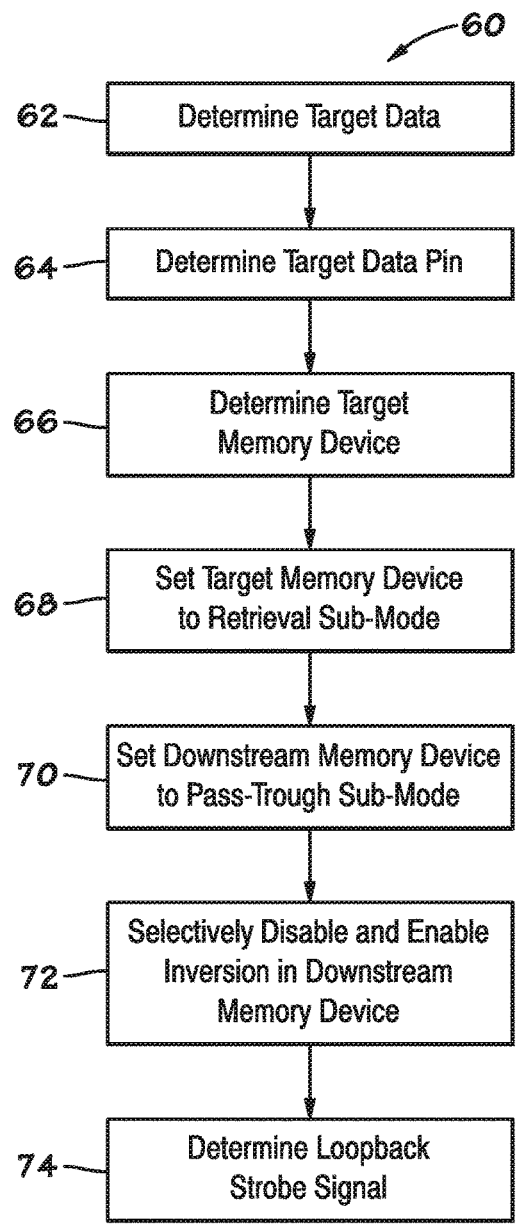
FIG. 5 is a flow diagram of a process for determining loopback parameters, in accordance with an embodiment.

Returning to the process 60 of FIG. 5, the memory controller 16 may determine a loopback strobe signal (process block 74). The loopback strobe signal may facilitates reading the target loopback signal outputted via the loopback pin 30. In some embodiments, the loopback strobe signal may be determined based at least in part on a strobe signal used to read a data signal corresponding with the target data. Additionally, in some embodiments, the loopback strobe signal may be determined based at least in part on the sampling rate used to determine the loopback signal from the corresponding data signal.

Figure 7:
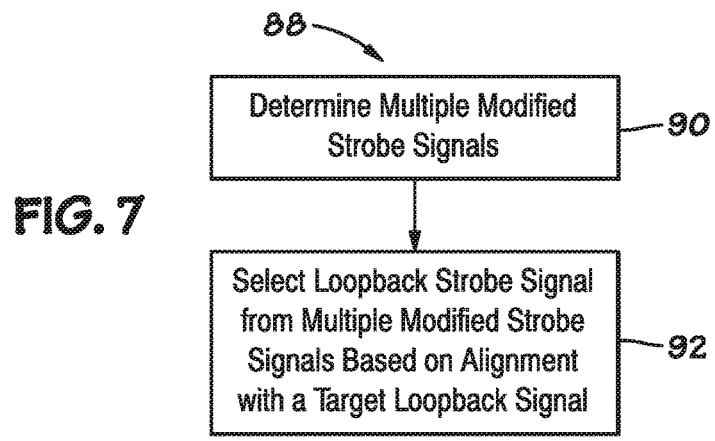
FIG. 7 is a flow diagram of a process for determining a loopback strobe signal, in accordance with an embodiment.

To help illustrate, an example of a process 88 for determining a loopback strobe signal is described in FIG. 7. Generally, the process 88 includes determining multiple modified strobe signals (process block 90) and selecting a loopback strobe signal from the multiple modified strobe signals based on alignment with a loopback signal (process block 92). In some embodiments, the process 88 may be implemented by executing instructions stored in a tangible, non-transitory, computer-readable medium, such as one or more memory devices 20, using processing circuitry, such as the processor 12 and/or the memory controller 16.

Thus, in some embodiments, the memory controller 16 may determine multiple modified strobe signals (process block 90). In some embodiments, a modified strobe signal may be determined based at least in part on a strobe signal corresponding with the target data. For example, a modified strobe signal may be determined by adjusting the characteristics (e.g., frequency or/and phase) of the strobe signal.

Figure 8:
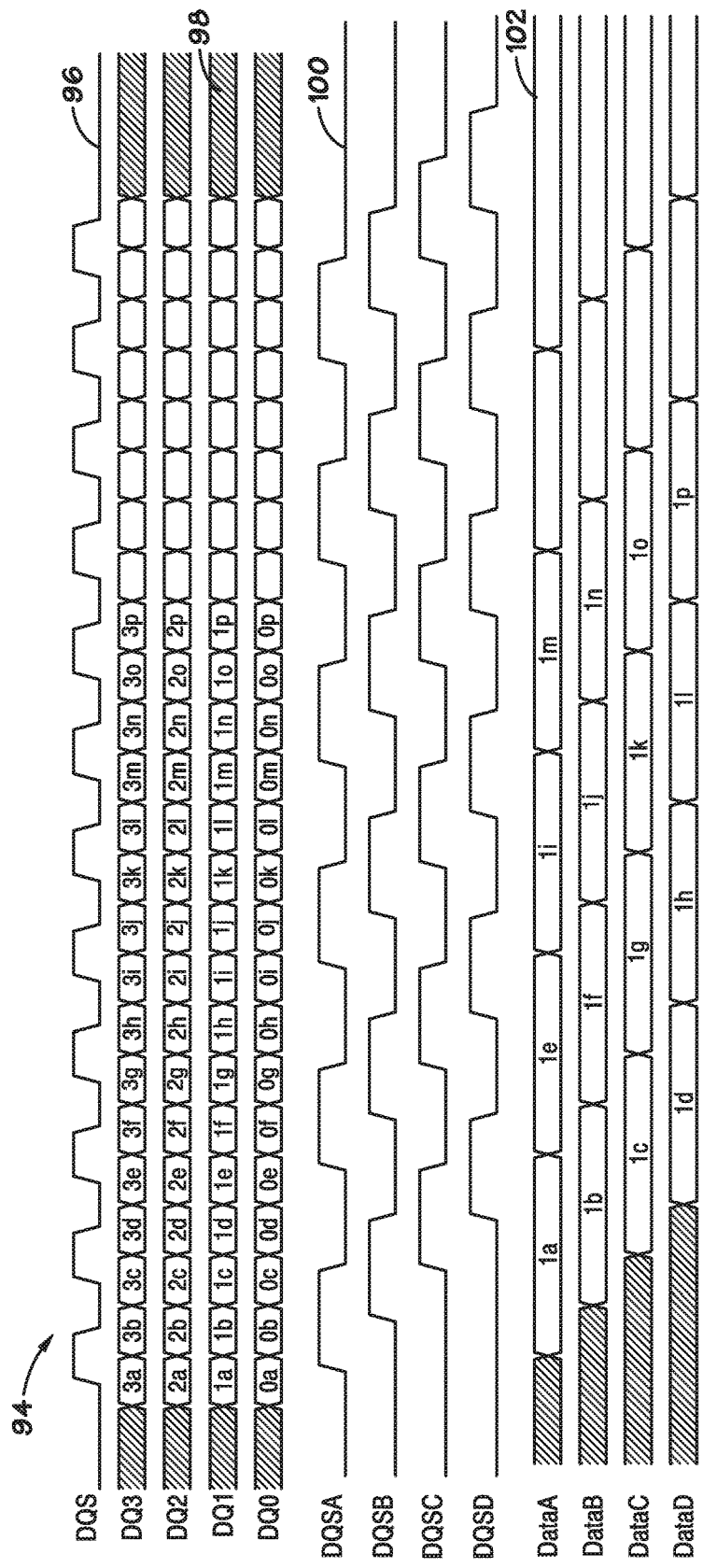
FIG. 8 is a timing diagram of a strobe signal, data signals, loopback data signals, and loopback strobe signals in the memory device of FIG. 3, in accordance with an embodiment.

To help illustrate, a timing diagram 94 including signal waveforms present in the memory system 14 is shown in FIG. 8. As depicted, the timing diagram 94 includes a strobe signal waveform 96, a data signal waveform 98, a loopback strobe signal waveform 100, and a target data waveform 102. In particular, the strobe signal waveform 96 indicates the strobe signal with a frequency that facilitates providing target transmission frequency from the target memory device 20. Additionally, the data signal waveform 98 indicates a data signal used to communicate target data. In particular, the data signal include a series of four sets of data which periodically repeat within the same signal (e.g., 1a, 1e, 1i, and 1m are all from the same set of data within the larger signal). In other embodiments, the data signal waveform 98 may have more or less than four sets of data represented. In this embodiment, to properly capture the target data waveform 102 from the periodically repeating data, target data isolation may occur every fourth period of the data signal waveform 98.

The memory controller 16 may modify the strobe signal waveform 96 to isolate the target data waveform 102 from the data signal waveform 98 on the rising edge of the strobe signal waveform 96. The strobe signal waveform 96 may be modified through adjustment to the waveform characteristics of the signal, as visualized through the multiple modified strobe signals (e.g., DQSA, DQSB, DQSC, and DQSD). The memory controller 16, as an example, may select the loopback strobe signal waveform 100 from the multiple modified strobe signals, as described by the process 88 in FIG. 7.

Returning to the process 88 of FIG. 7, the memory controller 16 may identify a loopback strobe signal from the multiple modified strobe signals (process block 92). For example, the memory controller 16 may identify the modified strobe signal which rising edge aligns with the center of the target data from the data signal as the loopback strobe signal. In other words, the memory controller 16 may select the modified strobe signal that facilitates isolating the target data from the data signal.

The timing diagram 94, as depicted in FIG. 8, visualizes the isolation of the loopback strobe signal. The selection, as described in process 88, results in the loopback strobe signal waveform 100. As described, the rising edge of the loopback strobe signal waveform 100 aligns with the center of the target data set (e.g., 1a, 1e, 1i, 1m . . . ) within the data signal waveform 98. The result of the isolation is the target data waveform 102. The additional waveforms not used in isolating the target data waveform 102 may be ignored for the purposes of transmission of the loopback signal. The target data waveform 102 may transmit through the loopback chain 24 to the loopback pin 30 as the target loopback signal.

Returning to the process 60 of FIG. 5, in this manner described with the process 88, the memory controller 16 may determine a loopback strobe signal (process block 74). As described above, the loopback strobe signal may facilitate reading the target loopback signal output via the loopback pin 30. The loopback strobe signal may isolate of the target data from the data signal and transmit the target data as the loopback signal.

Figure 9:
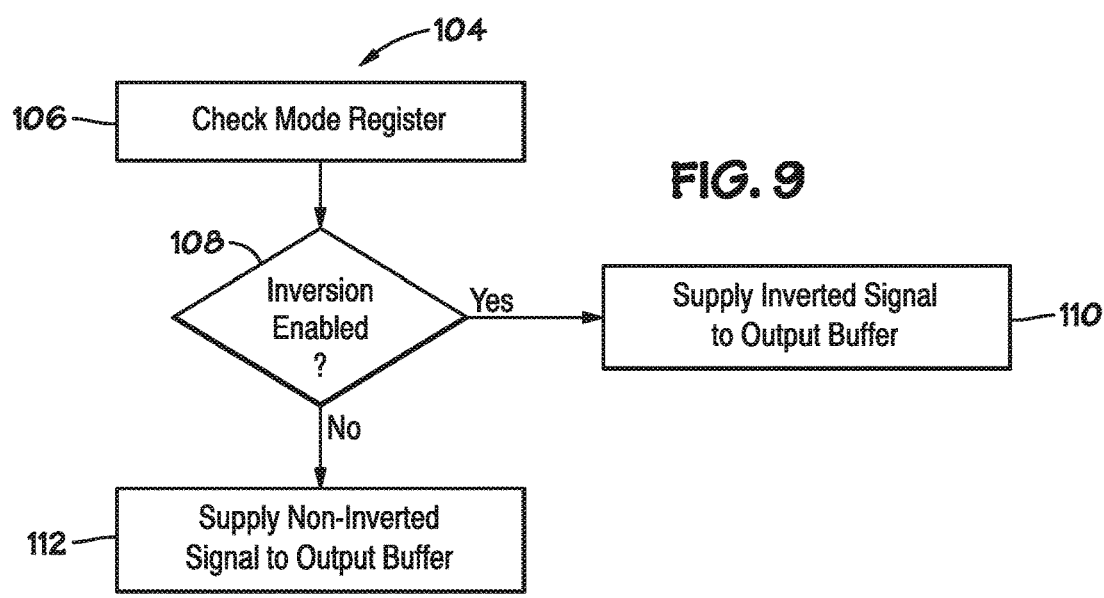
FIG. 9 is a flow diagram of a process for operating the memory device of FIG. 3 in a pass through sub-mode, in accordance with an embodiment.

Returning to the process 50 of FIG. 4, in this manner described with the process 60, the process 76, and the process 88, the loopback chain 24 may output a target loopback signal based at least in part on the determined loopback parameters (process block 58). To help illustrate, a process 104 for operating a downstream memory device 20 is described in FIG. 9. Generally, the process 104 includes checking a mode register (process block 106), determining whether inversion is enabled (decision block 108), supplying an inverted data signal to an output buffer when inversion is enabled (process block 110), and supplying a non-inverted data signal to the output buffer when inversion is not enabled (process block 112). In some embodiments, the process 104 may be implemented by executing instructions stored in a tangible, non-transitory, computer-readable medium, such as one or more memory devices 20, using processing circuitry, such as the processor 12 and/or the memory controller 16.

Thus, in some embodiments, the memory controller 16 may check the mode registers 18 for the specific operational code indicating which operational mode the specific memory device 20 is set to (process block 106). As described above, the mode registers 18 may indicate whether inversion is enabled in the memory device 20 (decision block 108). If inversion is enabled, the multiplexer 44 may transmit the inverted loopback signal to the output buffer 46 (process block 110). On the other hand, when inversion is not enabled, the multiplexer 44 may transmit the non-inverted loopback signal to the output buffer 46 (process block 112). In this manner, the memory controller 16, through communication to the multiplexer 44, may selectively instruct a downstream memory device 20 to transmit either the inverted loopback signal or the non-inverted loopback signal as the pass-through loopback signal. The selected pass-through output loopback signal 49 may be transmitted through the remaining downstream memory devices 20 in a similar manner.

Figure 10:
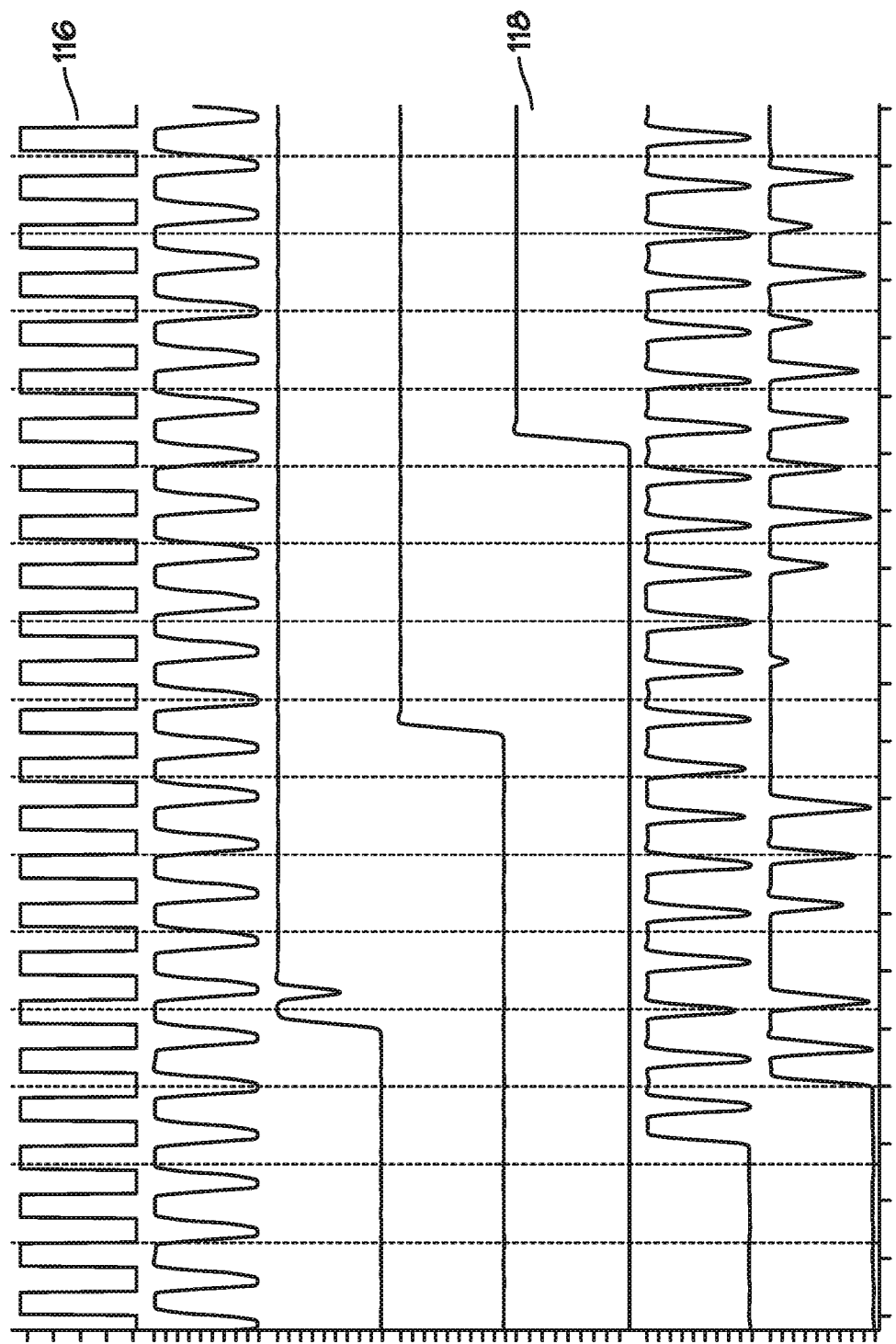
FIG. 10 is a timing diagram of non-inverted loopback signals, in accordance with an embodiment.
Figure 11:
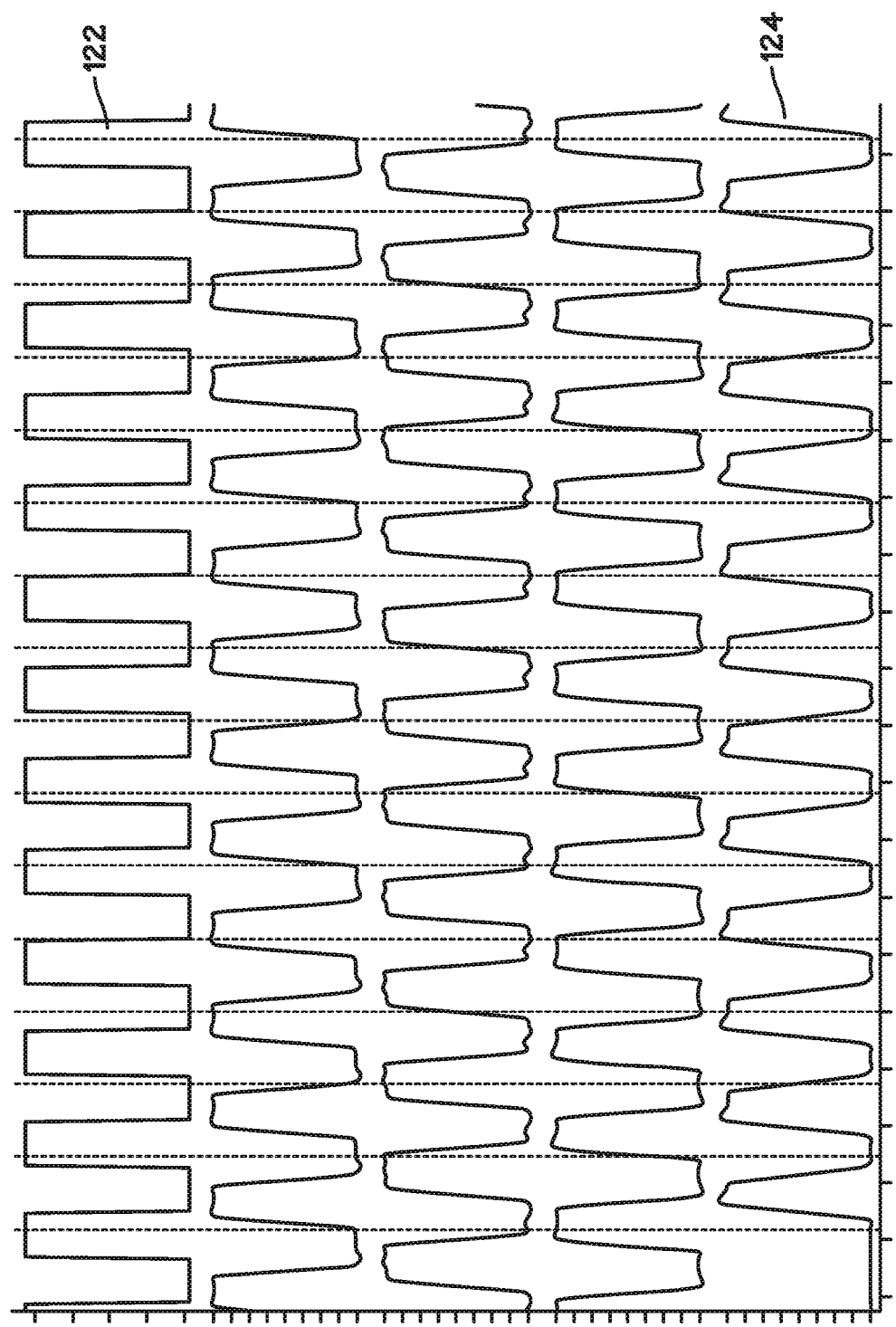
FIG. 11 is a timing diagram of selectively inverted loopback signals, in accordance with an embodiment.

As described above, selectively inverting the loopback signal during transmission may facilitate improving signal integrity, thus, accuracy of memory operational monitoring. The selective inversion technique aforementioned may improve transmitted signal integrity by reducing the likelihood of variations (e.g., timing) stacking across multiple memory devices 20. To help illustrate, waveforms describing the resulting target loopback signals are shown in FIGS. 10 and 11. In particular, FIG. 10 describes a target loopback signal resulting from implementation of non-inverting techniques and FIG. 11 describes target loopback signal resulting from implementation of selectively inverting techniques.

A non-inverted loopback signal results graph 114 in FIG. 10 and an inverted loopback signal results graph 120 in FIG. 11 were created using an input loopback signal frequency of 3200 MHz and a 50% duty cycle. The non-inverted loopback signal results graph 114 shows the target loopback signal output that occurred after transmission through twenty DRAM memory devices without the selective inversion technique applied to the transmission. The inverted loopback signal results graph 120 shows the final loopback output that occurred after transmission through twenty DRAM memory devices with the selective inversion techniques applied to the transmission.

The combination of the non-inverted loopback signal results graph 114 and the inverted loopback signal results graph 120 show the importance of implementing a technique to improve transmitted loopback signal integrity. For proper use in monitoring operations, the output loopback signal may resemble the input loopback signal at the end of the loopback signal transmission. If the output loopback signal resembles the input loopback signal, a negligible amount of loopback signal degradation occurred. In the non-inverted loopback signal results graph 114, comparing a non-inverted loopback input signal 116 to a non-inverted loopback output signal 118 shows that the non-inverted loopback input signal 116 experienced degradation by the output of the target loopback signal. The non-inverted loopback output signal 118 substantially differs from the non-inverted loopback input signal 116. The conclusion drawn from the comparison is that a non-negligible amount of loopback signal degradation occurred in the non-inverted loopback signal results graph 114.

Additionally, comparing the inverted loopback input signal 122 to the inverted loopback output signal 124 in the inverted loopback signal results graph 120 shows that the inverted loopback output signal 124 is substantially similar to the inverted loopback input signal 122. The conclusion drawn from the comparison is that a negligible amount of loopback signal degradation occurred during transmission of the inverted loopback input signal 122 when the aforementioned selective inversion techniques are applied.

Thus, the technical effects of the present disclosure include facilitating improved monitoring of memory device operations, for example, by improving signal integrity of a loopback signal indicative of memory device operation. The method describes a selective signal inversion process to preserve the loopback signal while transmitting through the loopback chain without affecting the final output of the loopback signal.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A memory module comprising:
   a first loopback pin communicatively coupled to a first loopback chain; and
   a first plurality of memory devices coupled in series to form the first loopback chain, wherein the first plurality of memory devices comprises:
      a first memory device comprising first storage circuitry; and
      a second memory device comprising second storage circuitry and coupled in the first loopback chain downstream relative to the first memory device;
      wherein, when first data communicated with the first storage circuitry is targeted by loopback parameters:
         the first memory device is configured to generate a first loopback signal based at least in part on the first data; and
         the second memory device is configured to generate a second loopback signal by inverting the first loopback signal to facilitate monitoring operation of the first memory device when a first output loopback signal generated based at least in part on the second loopback signal is output via the first loopback pin, wherein:
   the first memory device is configured to:
      generate a first data signal indicative of the first data using a first data frequency while operating in a normal mode; and
      generate the first loopback signal by sampling the first data signal using a second data frequency while operating in a loopback mode and the first data communicated with the first storage circuitry is targeted by the loopback parameters, wherein the first data frequency is greater than the second data frequency and an integer multiple of the second data frequency; and
   the second memory device is configured to:
      generate a second data signal indicative of second data communicated with the second storage circuitry in the second memory device using the first data frequency while operating in the normal mode;
      generate the second loopback signal by sampling the second data signal using the second data frequency while operating in the loopback mode and the second data communicated with the first storage circuitry is targeted by the loopback parameters; and generate the second loopback signal by selecting an inverted loopback signal from between the inverted loopback signal and a non-inverted loopback signal.

2. The memory module of claim 1, comprising:
a data pin communicatively coupled to the first memory device, wherein the data pin is configured to output a data signal indicative of the first data communicated with the first storage circuitry when the first memory device operates in a normal mode; and
a strobe pin communicatively coupled to the first memory device, wherein the strobe pin is configured to output a strobe signal that facilitates reading the data signal output from the data pin to determine the first data when the first memory device operates in the normal mode;
wherein first loopback pin is configured to output the first output loopback signal when the first memory device operates in a loopback mode to enable an external host controller to monitor operation of the first memory device based at least in part on the analysis of the first output loopback signal.

3. The memory module of claim 1, wherein the first plurality of memory devices comprises a third memory device coupled in the first loopback chain downstream relative to the second memory device, wherein:
the third memory device comprises third storage circuitry separate from the first storage circuitry and the second storage circuitry; and
the third memory device is configured to generate the first output loopback signal by inverting the second loopback signal.

4. The memory module of claim 1, wherein the first plurality of memory devices comprises a third memory device coupled between the second memory device and first loopback pin, wherein:
the third memory device comprises third storage circuitry separate from the first storage circuitry and the second storage circuitry; and
the third memory device is configured to:
receive an input loopback signal generated based at least in part on the second loopback signal; and
generate the first output loopback signal by not inverting the input loopback signal.

5. The memory module of claim 1, wherein each of the first plurality of memory devices comprises:
an input buffer communicatively coupled to an upstream output buffer in a upstream memory device in the first loopback chain, wherein the input buffer is configured to generate a non-inverted loopback signal when an input loopback signal is received from the upstream memory device;
an inverter communicatively coupled to the input buffer, wherein the inverter is configured to generate an inverted loopback signal based at least in part on the non-inverted loopback signal;
a multiplexer communicatively coupled to the input buffer and the inverter, wherein the multiplexer is configured to select one of the inverted loopback signal and the non-inverted loopback signal as a selected loopback signal based at least in part on a control signal;
storage circuitry configured to store data; and
an output buffer communicatively coupled to the storage circuitry, a downstream output buffer in a downstream memory device in the first loopback chain, and the multiplexer, wherein the output buffer is configured to:
output a generated loopback signal indicative of data stored in the storage circuitry when a corresponding memory device is targeted by the loopback parameters; and
output the selected loopback signal when the input loopback signal is received from the upstream memory device.

6. A memory module comprising:
a first loopback pin communicatively coupled to a first loopback chain;
a first plurality of memory devices coupled in series to form the first loopback chain, wherein the first plurality of memory devices comprises:
a first memory device comprising first storage circuitry; and
a second memory device comprising second storage circuitry and coupled in the first loopback chain downstream relative to the first memory device;
wherein, when first data communicated with the first storage circuitry is targeted by loopback parameters:
the first memory device is configured to generate a first loopback signal based at least in part on the first data; and
the second memory device is configured to generate a second loopback signal by inverting the first loopback signal to facilitate monitoring operation of the first memory device when a first output loopback signal generated based at least in part on the second loopback signal is output via the first loopback pin; and
a memory controller communicatively coupled to each of the first plurality of memory devices, wherein the memory controller is configured to:
determine a targeted memory device based at least in part on the loopback parameters, wherein the loopback parameters indicate target data to be monitored; and
when the first plurality of memory devices comprises the targeted memory device:
instruct the targeted memory device to operate in a retrieval sub-mode, wherein the targeted memory device is configured to generate a target loopback signal by sub-sampling a data signal indicative of the target data;
determine number of downstream memory devices in the first loopback chain communicatively coupled between the targeted memory device and the first loopback pin;
instruct each of the downstream memory devices to operate in an inverting pass-through sub-mode when an even number of memory devices is communicatively coupled between the targeted memory device and the first loopback pin; and
instruct an odd number of the downstream memory devices to operate in a non-inverting pass-through sub-mode and remaining of the downstream memory devices to operate in the inverting pass-through sub-mode when an even number of memory devices are communicatively coupled between the targeted memory device and the first loopback pin.

7. The memory module of claim 1, comprising:
a second loopback pin communicatively coupled to a second loopback chain; and
a second plurality of memory devices coupled in series to form the second loopback chain, wherein the second plurality of memory devices comprises:
a third memory device comprising third storage circuitry; and a fourth memory device comprising fourth storage circuitry and coupled in the second loopback chain downstream relative to the third memory device;

wherein, when second data communicated with the third storage circuitry is targeted by the loopback parameters:

the third memory device is configured to generate a third loopback signal based at least in part on the second data; and the fourth memory device is configured to generate a fourth loopback signal by inverting the third loopback signal to facilitate monitoring operation of the third memory device when a second output loopback signal generated based at least in part on the fourth loopback signal is output via the second loopback pin.

8. The memory module of claim 1, wherein:

the memory module comprises a dual in-line memory module; and each of the first plurality of memory devices comprises a dynamic random-access memory device.

\* \* \* \* \*

UNITED STATES PATENT AND TRADEMARK OFFICE
CERTIFICATE OF CORRECTION

PATENT NO. : 10,393,803 B2
APPLICATION NO. : 15/693114
DATED : August 27, 2019
INVENTOR(S) : David D. Wilmoth Page 1 of 2

It is certified that error appears in the above-identified patent and that said Letters Patent is hereby corrected as shown below:

In the Drawings

In Fig. 10, Sheet 6 of 7, delete " 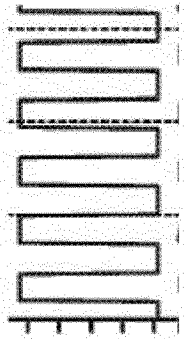 " and insert -- 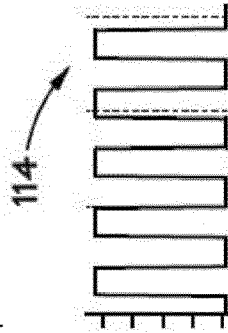 --, therefor.

In Fig. 11, Sheet 7 of 7, delete " 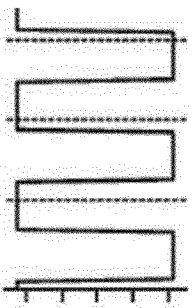 " and insert -- 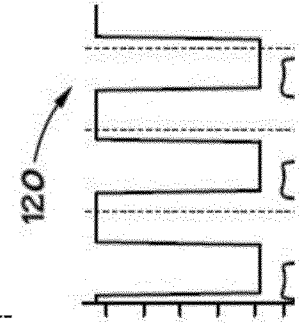 --, therefor.

In the Specification

In Column 4, Line 15, please delete "into more or more memory modules" and insert --into one or more memory modules--, therefor.

In Column 4, Line 19, please delete "an example of a memory module 26" and insert --an example of a memory system 25 having a memory module 26--, therefor.

Signed and Sealed this
Twenty-sixth Day of April, 2022

Katherine Kelly Vidal
*Director of the United States Patent and Trademark Office*

CERTIFICATE OF CORRECTION (continued)
U.S. Pat. No. 10,393,803 B2

In Column 5, Line 3, please delete "a target loopback signals." and insert --a target loopback signal.--, therefor.

In Column 5, Line 25, please delete "An example memory device 20" and insert --An example of a portion of a memory system 35, including a memory device 20--, therefor.

In Column 8, Line 60, please delete "20 daisy chain connected to the target memory device 20" and insert --20 in daisy chain connected to the target memory device 20--, therefor.